United States Patent [19]
Shimoji

[11] Patent Number: 5,821,578
[45] Date of Patent: *Oct. 13, 1998

[54] SEMICONDUCTOR SWITCHING ELEMENT, PROGRAMMABLE FUNCTIONAL DEVICE, AND OPERATION METHODS FOR PROGRAMMABLE FUNCTIONAL DEVICE

[75] Inventor: Noriyuki Shimoji, Kyoto, Japan

[73] Assignee: Rohm Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 730,223

[22] Filed: Oct. 15, 1996

[30] Foreign Application Priority Data

Oct. 13, 1995 [JP] Japan ................................. 7-265531

[51] Int. Cl.$^6$ ........................... H01L 29/76; H01L 29/94; H01L 31/062; H01L 31/113
[52] U.S. Cl. ........................................................... 257/295
[58] Field of Search .................................... 257/130, 131, 257/295

[56] References Cited

U.S. PATENT DOCUMENTS

| | | | |
|---|---|---|---|
| 4,870,615 | 9/1989 | Maruyama et al. ................... | 257/185 |
| 5,081,375 | 1/1992 | Pickett et al. ........................... | 307/465 |
| 5,309,392 | 5/1994 | Ootsuka et al. ........................ | 257/295 |
| 5,365,094 | 11/1994 | Takasu .................................... | 257/295 |
| 5,412,600 | 5/1995 | Nakajima ............................... | 365/185 |
| 5,541,870 | 7/1996 | Mihara et al. .......................... | 365/145 |

*Primary Examiner*—Stephen Meier
*Attorney, Agent, or Firm*—Merchant, Gould, Smith, Edell, Welter & Schmidt

[57] ABSTRACT

A floating gate (FG) of a ferroelectric transistor (FTR11) and a source (SS) of a selecting transistor (STR11) are interconnected. A control gate (FCG) of the ferroelectric transistor (FTR11) is connected to a word line (WL1), a drain (SD) of the selecting transistor (STR11) is connected to a bit line (BL11), and a gate (SG) of the selecting transistor (STR11) is connected to a gate line (G). In the writing mode, "5V" is given to the gate line (G) to set the selecting transistors (STR11, . . . ) to the on state. A ferroelectric layer (FM) is polarized by giving a suitable voltage to the word lines (WL1, . . . ) and the bit lines (BL1, . . . ). In the operation mode, "0V" is given to the gate line (G) to set the selecting transistors (STR11, . . . ) to the off state.

22 Claims, 9 Drawing Sheets

STR11 (sec. P1-P1)

FTR11 (sec. P2-P2)

FIG.5

| writing mode | | BL1 | BL2 | WL1 | WL2 | G | Sub |
|---|---|---|---|---|---|---|---|
| (a) | ON state | 0 v | 2.5 v | 5 v | 0 v | 5 v | 0 v |
| (b) | OFF state | 5 v | 0 v | 0 v | 0 v | 5 v | 0 v |
| (c) | Operating mode | open | open | 0 v | 0 v | 0 v | 0 v |

FIG.6

| | writing mode | BL1 | BL2 | WL1 | WL2 | G | Sub |
|---|---|---|---|---|---|---|---|
| (a) | ON state | 0 v | 2.5 v | 5 v | 0 v | 5 v | 0 v |
| (b) | OFF state | 5 v | 2.5 v | 0 v | 5 v | 5 v | 0 v |
| (c) | Operating mode | open | open | 0 v | 0 v | 0 v | 0 v |

FIG.8

| writing mode | | BL1 | BL2 | WL1 | WL2 | G1 | G2 | Sub |
|---|---|---|---|---|---|---|---|---|
| (a) | ON state | 0v | 5v | 5v | 0v | 5v | 0v | 0v |
| (b) | OFF state | 5v | 0v | 0v | 0v | 5v | 0v | 0v |
| (c) | Operating mode | open | open | 0v | 0v | 0v | 0v | 0v |

SEMICONDUCTOR SWITCHING ELEMENT, PROGRAMMABLE FUNCTIONAL DEVICE, AND OPERATION METHODS FOR PROGRAMMABLE FUNCTIONAL DEVICE

BACKGROUND OF THE INVENTION

1. Field of the Invention

This invention relates to a semiconductor switching element and more specifically to a semiconductor switching element having ferroelectric transistors.

2. Description of the Prior Art

A PLD (Programmable Logic Device) is known as an LSI to which a user can write logical functions. The PLDs include many kinds from PLAs (Programmable Logic Arrays) of a small scale to FPGAs (Field Programmable Gate Array) of a large scale.

Each PLD is constituted with many logic circuits disposed on a chip and the logic circuits are interconnected through programmable switches. Therefore, a user can set up any required function by opening or closing those switches according to a specified pattern.

In this way, LSIs having required logical functions may be provided within a short delivery time by using the PLD.

However, the conventional PLDs as described above have a problem wherein the conventional PLD uses a fuse (2) as a programmable switch as shown in FIG. 9A.

In order to disconnect the wire (4) from the wire (6), the fuse (2) may be burned off. However, once the fuse (2) is burned off, it cannot be connected again and therefore, the logical function cannot be rewritten.

In contrast to the arrangement with the fuse (2), there is an arrangement with an anti-fuse with which both wires (4) and (6) are insulated in advance from each other and interconnected when the insulation is broken. However, like the arrangement with the fuse (2), this arrangement also does not permit the logical functions to be rewritten. As a result, neither arrangement can perform logical function tests or operation tests of the switch itself.

To solve the problem, an EEPROM (Electrically Erasable and Programmable Read Only Memory) (8) as shown in FIG. 9B as a switch in place of the fuse (2) may be used. However, although the logical functions may be rewritten by the use of the EEPROM (8), the rewriting takes much time. Therefore, such an arrangement cannot be used when the rewriting is required in real time. On the other hand, an SRAM (Static Random Access Memory) (10) as shown in FIG. 9C may be used to rewrite the logical functions in real time. However, although the rewriting in real time is possible with the SRAM(10), since the SRAM (10) is volatile, the stored contents disappear when the power is turned off. Therefore, it is necessary to prepare a nonvolatile memory to retain the rewritten contents and to load the contents in the nonvolatile memory into the SRAM (10) when the power is turned on.

Another problem is that since the SRAM itself consists of many transistors, it requires a large area.

OBJECT AND SUMMARY OF THE INVENTION

The object of this invention is to provide a programmable functional device, an operating method of the programmable functional device, and a semiconductor switching element for use in the programmable functional device capable of solving the problems associated with the conventional programmable functional devices such as PLDs, rewriting functions in real time, and retaining the rewritten data, with a high reliability in a compact size.

The semiconductor switching element of of this invention is characterized in that it is provided with a ferroelectric transistor comprising an insulation film made of insulation substance, a lower conductive layer made of conductive substance, a ferroelectric layer made of ferroelectric substance, and an upper conductive layer made of conductive substance, stacked one over another in that order on a channel region formed between a first region and a second region; and a selecting transistor comprising an insulation film made of insulation substance and a conductive layer made of a conductive substance, stacked one over another in that order on a channel region formed between a first region and a second region, the lower conductive layer of the ferroelectric transistor and the first region of the selecting transistor are interconnected.

The programmable functional device of this invention for obtaining required functions by interconnecting or disconnecting a plurality of circuit elements prepared in advance through a programmable switching means is characterized in that it uses the semiconductor element for switching as the switching means;

each of the circuit elements to be interconnected or disconnected is connected to the first and the second regions of the ferroelectric transistor constituting the semiconductor element for switching.

The operation method for the programmable functional device of this invention is characterized in that:

switching data is written into the ferroelectric transistor constituting the semiconductor element for switching selected with any row selecting line and any column selecting line by applying a voltage having a predetermined value and polarity between the row selecting line and the column selecting line while applying a write enabling voltage to a write enabling line, and required functions are obtained by interconnecting or disconnecting the switching circuits according to the written data by applying a write disabling voltage to the write enabling line.

The operation method for the programmable functional device of this invention is characterized in that:

switching data is written into the ferroelectric transistor constituting the semiconductor element for switching selected with any row selecting line and any column selecting line by applying a voltage having a predetermined value and polarity between the row selecting line and the column selecting line while applying a write enabling voltage to a row write enabling line, and that:

required functions are obtained by interconnecting or disconnecting the switching circuits according to the written data by applying a write disabling voltage to the row write enabling line.

The operation method for the programmable functional device of this invention is characterized in that:

switching data is written into the ferroelectric transistor constituting the semiconductor element for switching selected with any row selecting line and any column selecting line by applying a voltage having a predetermined value and polarity between the row selecting line and the column selecting line while applying a write enabling voltage to a column write enabling line, and required functions are obtained by interconnecting or disconnecting the switching circuits according to the written data by applying a write disabling voltage to the column write enabling line.

The above and other objects and characteristic constitutions broadly indicated above will become more apparent in the following description made in reference to the appended drawings.

BRIEF DESCRIPTION OF THE DRAWINGS

FIG. 5 is an operational state table of a logic array of a PLA according to an embodiment of this invention.

FIG. 6 is another example of an operational state table of a logic array of a PLA according to an embodiment of this invention.

FIG. 8 is an operational state table of a logic array of a PLA according to another embodiment of this invention.

DESCRIPTION OF THE PREFERRED EMBODIMENTS

Figure 2:
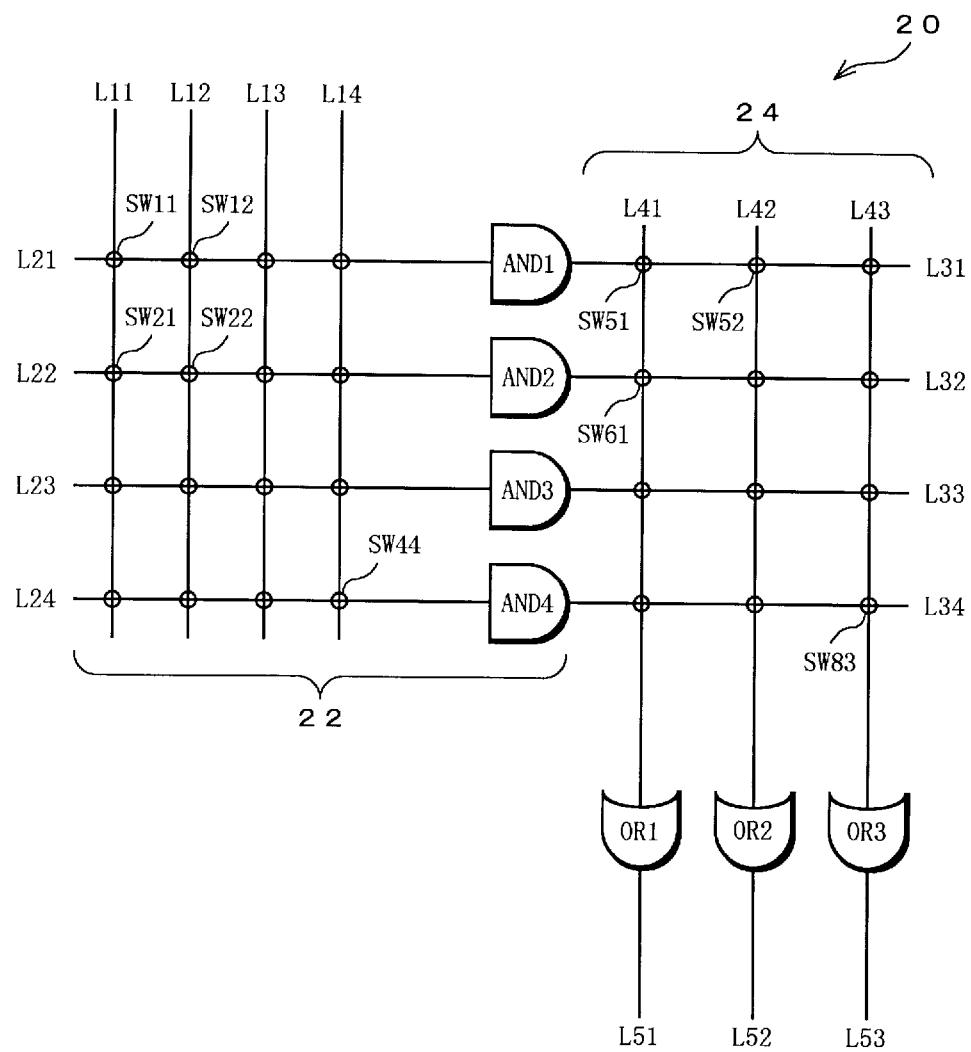
FIG. 2 is a partial schematic view of a logic array circuit of a PLA according to an embodiment of this invention.

FIG. 2 schematically shows a circuit of a logic array (20) of a PLA (not shown) which is a programmable functional device of the first embodiment of this invention. The PLA is a PLD of a relatively simple constitution and its logic array is provided with an AND part (22) and an OR part (24). By the way, FIG. 2 is only a partial view of the circuit constitution of the logic array (20) for the purpose of illustration and the actual logic array (20) is of a much more complicated constitution.

In the example of FIG. 2, the AND part (22) is provided with circuit elements: four data input lines (L11, L12, L13 and L14), four AND input lines (L21,L22,L23 and L24) and four AND gates (AND1, AND2, AND3 and AND4).

Semiconductor elements for switching or switches (SW11–SW44) are provided at 16 intersection points where the data input lines (L11, L12, L13 and L14) intersect the AND input lines (L21, L22, L23 and L24).

The OR part (24) is provided with circuit elements: four AND output lines (L31, L32, L33 and L34), three OR input lines (L41, L42 and L43), three OR gates (OR1, OR2 and OR3), and three OR output lines (L51, L52 and L53).

As in the AND part (22), semiconductor elements for switching or switches (SW51–SW83) are provided in the OR part (24) at 12 intersecting points where the AND output lines (L31, L32, L33 and L34) intersect the OR input lines (L41, L42 and L43).

By the way, while four AND gates (AND1, AND2, AND3 AND4) and three OR gates (OR1, OR2 and OR3) are used in FIG. 2 for the convenience of explanation, in the actual circuit, a circuit which is logically equivalent to that of FIG. 2 may be constituted with seven NAND gates in place of those gates.

Figure 1:
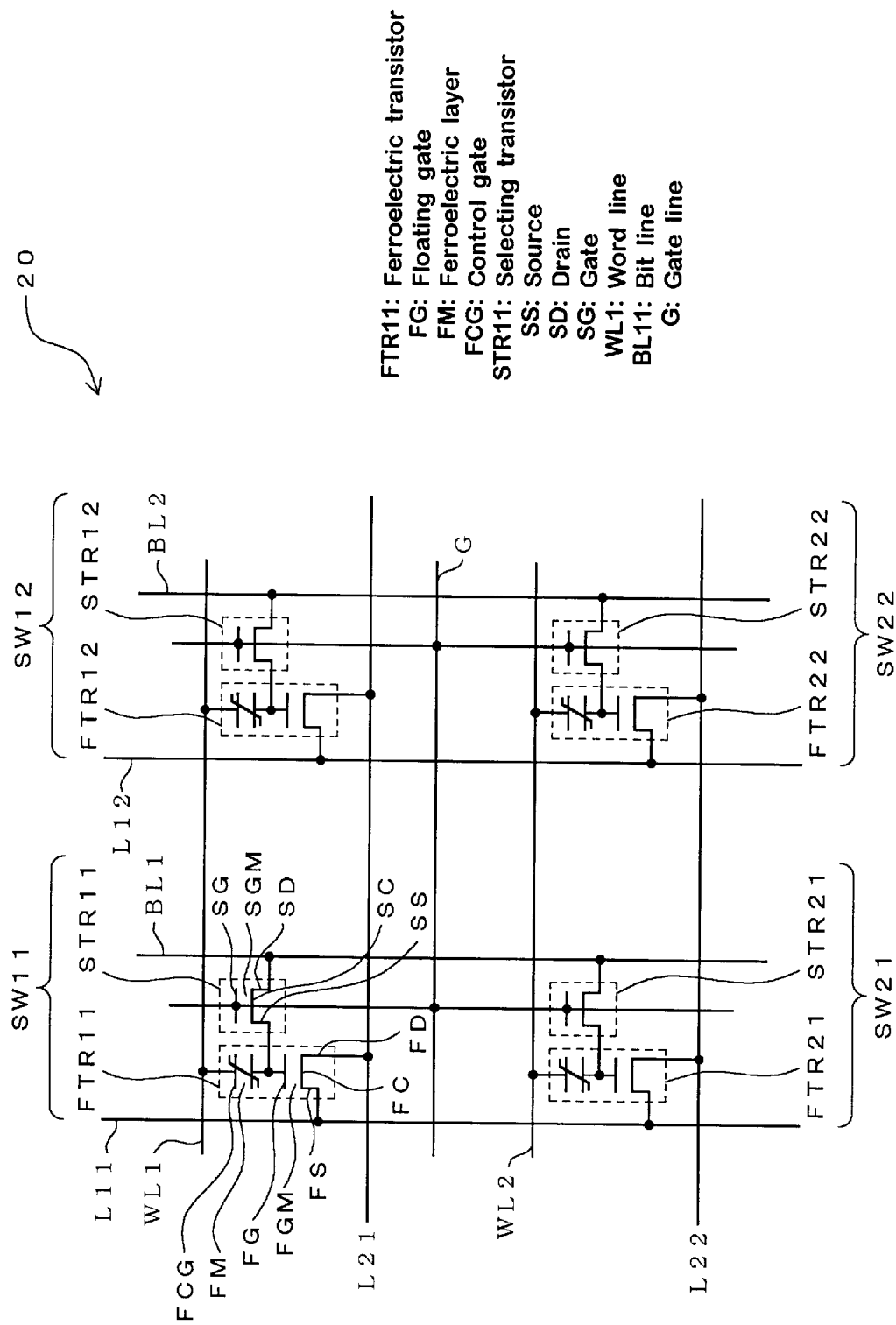
FIG. 1 is an enlarged circuit diagram in the vicinity of a switch used in a logic array constituting a PLA according to an embodiment of this invention.

FIG. 1 shows an enlarged circuit diagram in the vicinity of the switch (SW11). The switch (SW11) is provided with a ferroelectric transistor (FTR11) and a selecting transistor (STR11).

The ferroelectric transistor (FTR11) may be constituted on a channel region (FC) formed between a first region or a source (FS) and a second region or a drain (FD) by placing an insulation film or a gate oxidation film (FGM), a lower conductive layer or a floating gate (FG), a ferroelectric layer (FM), and an upper conductive layer or a control gate (FCG) one over another in that order.

The selecting transistor (STR11) may be constituted on a channel region (SC) formed between a first region or a source (SS) and a second region or a drain (SD) by placing an insulation film or a gate oxidation film (SGM) and a conductive layer or a gate (SG) one over the other in that order.

As will be described later, the floating gate (FG) of the ferroelectric transistor (STR11) and the source (SS) of the selecting transistor (STR11) are directly interconnected.

The source (FS) of the ferroelectric transistor (FTR11) is connected to the data input line (L11), and the drain (FD) is connected to the AND input line (L21).

The control gate (FCG) of the ferroelectric transistor (FTR11) is connected to a row selecting line or a word line (WL1). The drain (SD) of the selecting transistor (STR11) is connected to a column selecting line or a bit line (BL11). The gate (SG) of the selecting transistor (STR11) is connected to a write enabling line or a gate line (G). Switches (SW12–SW83) are also connected in a similar manner.

Figure 3:
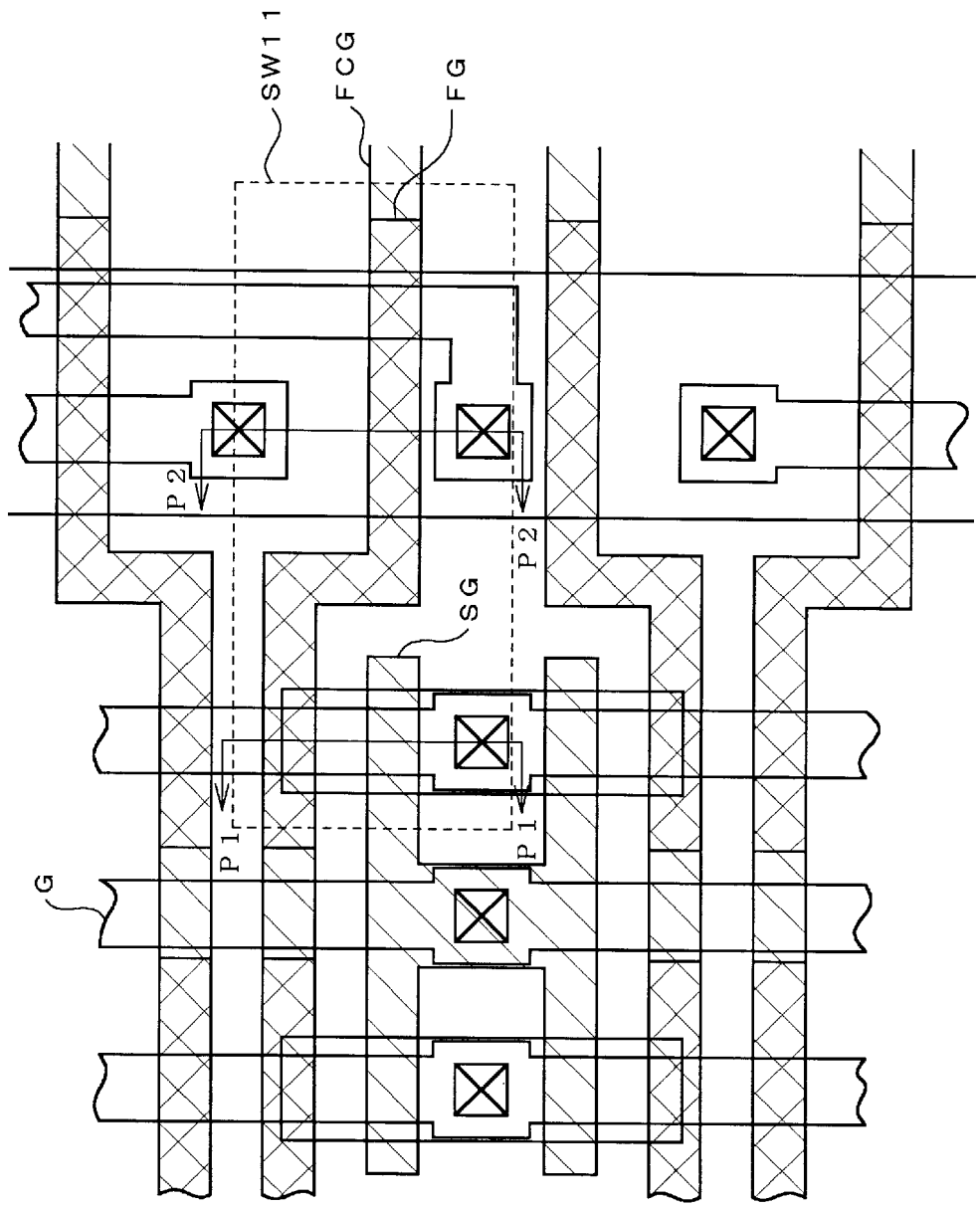
FIG. 3 is an actual plan view of the vicinity of a switch used in a logic array of a PLA according to an embodiment of this invention.
Figure 4A:
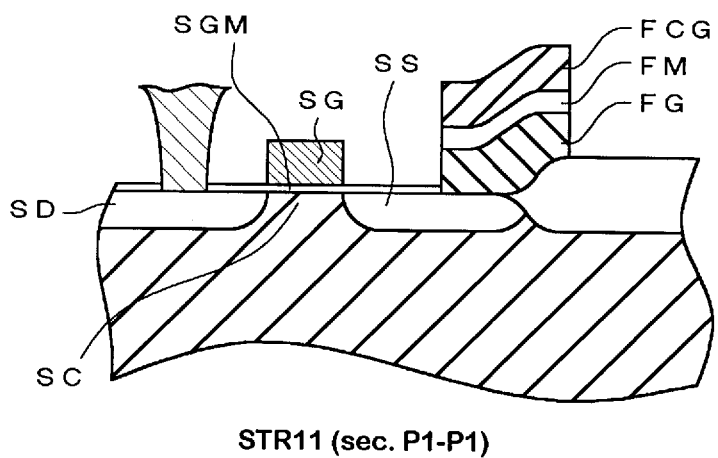
FIGS. 4A and 4B are cross-sectional views of a switch used in a logic array of a PLA according to an embodiment of this invention.
Figure 4B:
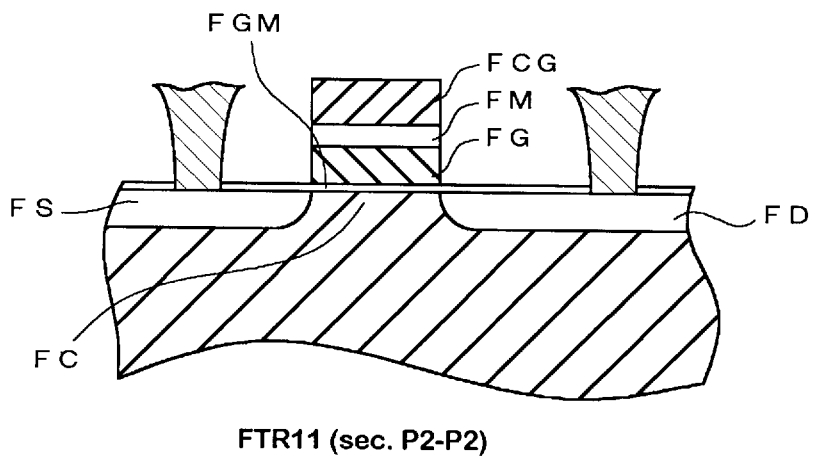

FIG. 3 shows an actual layout in plan view in the vicinity of the switch (SW11). FIGS. 4A and 4B respectively show the cross section P1—P1 (lateral cross section of the selecting transistor (STR11)) and the cross section P2—P2 (lateral cross section of the ferroelectric transistor (FTR11)) in FIG. 3. As shown in FIG. 4A, a floating gate (FG) of the ferroelectric transistor (FTR11) is formed in contact with the source (SS) right on the source (SS) of the selecting transistor (STR11).

In other words, the source (SS) of the selecting transistor (STR11) and the floating gate (FG) of the ferroelectric transistor (FTR11) are interconnected directly without intervening aluminum line or the like. Therefore, chip area is prevented from increasing due to extra wiring.

Next, the operation of the logic array (20) shown in FIG. 2 will be described in reference to FIG. 1. FIG. 5 shows voltage values applied to respective lines in respective modes.

First, the operation in the switching data writing (rewriting) mode will be described. For example, when it is intended to turn on the switch (SW11), "5V" is given to the word line (WL1) only as shown in FIG. 5(a), and "0V" is given to other word lines (WL2, . . . ). Also, "0V" is given to the bit line (BL1) only, and "2.5" is given to other bit lines (BL2, . . . ).

Furthermore, the selecting transistors (STR11, . . . ) are turned on by giving "5V" to the gate line (G). As a result, "5V" is applied to the control gate (FCG) of the ferroelectric transistor (FTR11) and "0V" is applied to its floating gate (FG). As a result, the ferroelectric layer (FM) is polarized in the direction in which the threshold voltage (Vth) of the ferroelectric transistor (FTR11) decreases. Thus, the switch (SW11) is set to the ON state.

On the other hand, "0V" is applied to the control gates (FCG) and to the floating gates (FG) of the ferroelectric transistors (FTR21, . . . ) constituting the switches (SW21, . . . ) in the same column as that of the switch (SW11). Therefore, no voltage difference occurs between the control gates (FCG) and to the floating gates (FG), and the ferroelectric layer (FM) of the ferroelectric transistor (FTR21, . . . ) maintains the current state.

"5V" is applied to the control gates (FCG) of the ferroelectric transistors (FTR12, . . . ) constituting the switches (SW12, . . . ) in the same row as that of the switch (SW11) and "2.5V" is applied to the floating gates of those. As a result, a differential voltage of 2.5 V is produced between both ends of the ferroelectric layer (FM) of the ferroelectric transistors (FTR12, . . . ). However, such an extent of differential voltage does not cause polarization, and therefore, the ferroelectric layer (FM) maintains the current state.

Furthermore, "0V" is applied to the control gates (FCG) of the ferroelectric transistors (FTR22, . . . ) constituting the switches (SW22, . . . ) in the different rows and columns as those of the switch (SW11) and "2.5" is applied to the floating gates (FG) of those. Therefore, like the above case, the ferroelectric layer (FM) of the ferroelectric transistors (FTR 22, . . . ) maintains the current state.

The reason for giving "0V" to the bit line (BL1) only and "2.5V" to other bit lines (BL2, . . . ) is as follows: when "5V" is given to other bit lines (BL2, . . . ), "5V" is applied to both the floating gates (FG) and the control gates of the ferroelectric transistors (FTR12, . . . ) constituting the switches (SW12, . . . ) in the same row as that of the switch (SW11), and therefore conveniently no differential voltage is produced.

However, "0V" is applied to the control gates (FCG) of the ferroelectric transistors (FTR22, . . . ) constituting the switches (SW22, . . . ) in different rows and columns from those of the switch (SW11), and "5V" is applied to the floating gates (FG) of those. As a result, the ferroelectric layers (FM) of the ferroelectric transistors (FTR22, . . . ) undesirably polarize in the direction opposite to that of the ferroelectric layers (FM) of the switch (SW11).

In view of the above, the voltage of 2.5 V, which does not cause polarization even if it is applied to the ferroelectric layers (FM), is given to other bit lines (BL2, . . . ).

Next, when it is intended to turnoff the switch (SW11), as shown in FIG. 5(b), "0V" is given to all the word lines (WL1, . . . ), "5V" to the bit line (BL1) only, and "0V" to other bit lines (BL2, . . . ).

Furthermore by giving "5V" to the gate line (G), the selecting transistors (STR11, . . . ) are turned on. As a result, "0V" is applied to the control gates (FCG) of the ferroelectric transistors (FTR11, FTR21, . . . ) constituting the switches in the same column as that of the switch (SW11), and "5V" to the floating gate (FG) of those. As a result, the ferroelectric layer (FM) polarizes in the direction of increasing the threshold voltage (Vth) of the ferroelectric transistor (FTR11, FTR 21, . . . ). In this way, the switches (SW11, SW21, . . . ) are set to the off state.

On the other hand, "0V" is also applied to the floating gates (FG) constituting the switches (SW12, SW22, . . . ) in columns other than the column of the switch (SW11). Therefore, no differential voltage occurs between the control gate (FCG) and the floating gate (FG), and the ferroelectric layers (FM) of the ferroelectric transistors (FTR12, FTR22, . . . ) maintain the current state.

By the way, while the above example is the case in which all the switches in the same column as that of the switch (SW11) are set to the off state, only the switch (SW11) may be set to the off state by applying the voltages shown in FIG. 6(b) to respective lines.

Next, operation in the operating mode will be described. In the operating mode, as shown in FIG. 5(c), all the bit lines (BL1, . . . ) are set to the open state. Selecting transistors (STR11, . . . ) are set to the off state by giving "0V" to the gate line (G). As a result, floating gates (FG) of the ferroelectric transistors (FTR11, . . . ) constituting all the switches (SW11, . . . ) are brought to a completely floating state.

Furthermore, "0V" is given to all the word lines (WL1, . . . ). This "0V" is of about the middle value between the threshold voltage (Vth) of the ferroelectric transistor when the switch is on, and the threshold voltage (Vth) when the switch is off as described above. Therefore, when "0V" is applied through the word lines (WL1, . . . ) to the control gates (FCG) of the ferroelectric transistors (FTR11, . . . ), the ferroelectric transistors (FTR11, . . . ) constituting respective switches (SW11, . . . ) assume a connected or disconnected state according to the polarized state of the ferroelectric layers (FM).

For example in FIG. 1, when the switch (SW11) is on, the ferroelectric transistor (FTR11) is on and therefore the data input line (L11) and the AND input line (L21) are in the connected state. By the way, as shown in FIGS. 5 and 6, the substrate potential (sub) is set to "0V" irrespective of the writing mode or operating mode.

Figure 7:
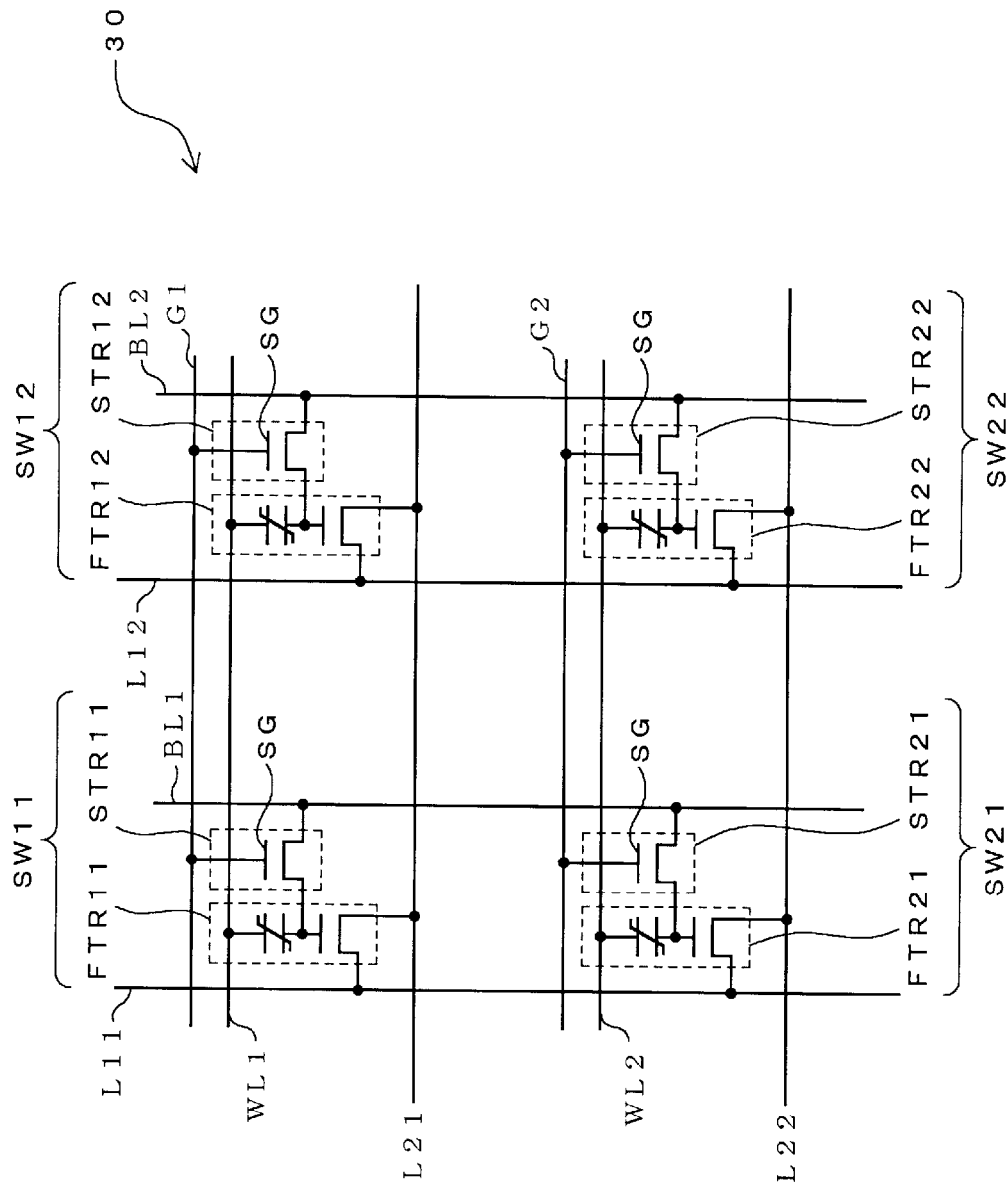
FIG. 7 is an enlarged circuit diagram in the vicinity of a switch used in a logic array of a PLA according to another embodiment of this invention.
Figure 9A:
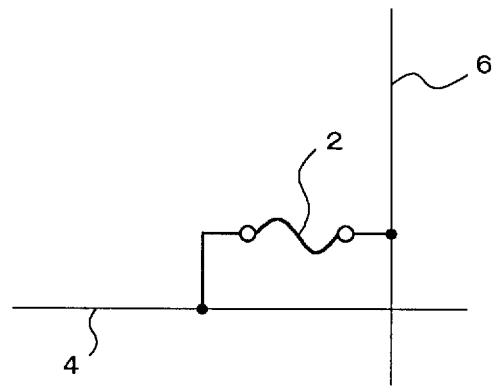
FIGS. 9A, 9B and 9C are diagrams of switch circuits used in a logic array of a conventional PLA.
Figure 9B:
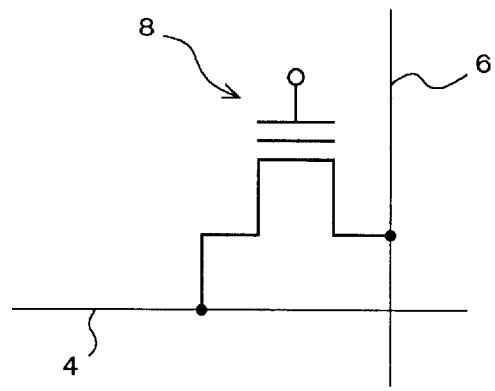
Figure 9C:
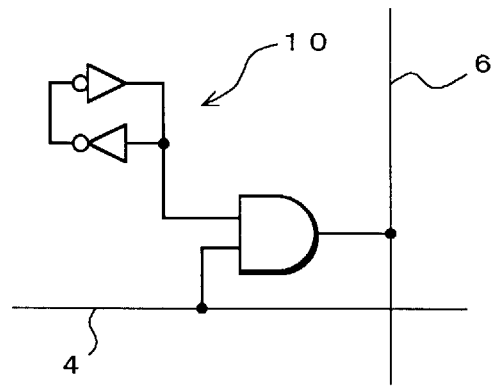

Next, FIG. 7 shows an enlarged view in the vicinity of the switch (SW11) of a logic array (30) constituting a PLA (not shown) which is a programmable functional device as another embodiment of this invention. The logic array (30) shown in FIG. 7 is provided with gate lines (G1, G2, . . . ) as row write enabling lines for respective rows, and therefore is different from the logic array (20) shown in FIG. 1 in which the gate line (G) is provided as a single write enabling line for the entire arrangement.

As shown in FIG. 7, the gates (SG) of the selecting transistors (STR11, STR12, . . . ) in the first row are connected to the gate line (G1) which is a row write enabling line. Similarly, the selecting transistors (STR21, STR22, . . . ) of the second and the following rows are connected to the gate lines (G2, . . . ) respectively.

Next, in reference to FIG. 7, operation of the logic array (30) will be described. FIG. 8 shows voltage values to be applied to respective lines in respective modes. First, operation in the switching data writing (rewriting) mode will be described. When it is intended to set the switch (SW11) to the on state, unlike the case of the logic array (20) (See FIG. 5) as shown in FIG. 8(a), "0V" is given to the bit line (BL1) only and "5V" to other bit lines (BL2, . . . ).

As a result, a differential voltage of "5V" is produced between both ends of the ferroelectric layer (FM) of only the ferroelectric transistor (FTR11) from among the ferroelectric transistors (FTR11, . . . ) constituting the first row of switches (SW11, . . . ), and no differential voltage is produced between both ends of ferroelectric layers (FM) of other ferroelectric transistors (FTR12, . . . ) in the first row. As a result, only the switch (SW11) from among those in the first row is reliably turned on.

Furthermore, "5V" is given to the gate line (G1) only, and "0V" is given to other gate lines (G2, . . . ). This causes all the selecting transistors in the second row and after (STR21, STR22, . . . ) to be set to off. As a result, the polarized state of the ferroelectric transistors (FTR21, . . . ) constituting the switches in the second row and after (SW21, . . . ) remains unchanged.

Therefore, writing into the on state is more reliable in comparison with the case of the logic array (20) shown in FIG. 1.

Next, when it is intended to set the switch (SW11) to the off state, like the case in which it is intended to set the switch (SW11) to the on state, as shown in FIG. 8(b), "5V" is given to the gate line (G1) only and "0V" is given to other gate lines (G2, . . . ). This causes, unlike the case of the logic array (20) (See FIGS. 5 and 6), the switch (SW11) only to be reliably set to the off state. By the way, operation in the operating mode is similar to that in the case of the logic array (20) (See FIG. 5).

While respective, rows are provided with the gate lines (G1, G2, . . . ), which are row write enabling lines in the embodiment described above, it may be alternatively arranged that each column is provided with a column write enabling line, and the gate (SG) of the selecting transistor in each column is connected to the corresponding column write enabling line.

The above embodiments are described with the first region of the ferroelectric transistor as the source (FS) and the second region as the drain (FD). However, they may be described with the first region as the drain (FD) and with the second region as the source (FS). A similar interchange is applicable for the selecting transistors.

Furthermore, the above embodiments are described with the constitution in which the source (SS) of the selecting transistor (STR11) is directly connected with the floating gate (FG) of the ferroelectric transistor (FTR11). However, both parts may be interconnected indirectly through an aluminum wire or the like.

Furthermore, the above embodiments are described with a plural number of switches (SW11, . . . ) in rows and columns intersecting each other at right angles. However, the rows and columns may be arranged to intersect each other at any angle other than the right angle. Furthermore, the plural number of switches (SW11, . . . ) may be arranged not in rows and columns but only in a column, for example. Furthermore, this invention may be applied to a circuit having a single switch.

Furthermore, the above embodiments are described with a PLA which is a kind of PLD as an example of programmable functional devices. However, this invention may be applied generally to programmable functional devices such as an FPGA, which is a kind of PLD. Furthermore, this invention may be applied not only to the programmable functional devices but also generally to semiconductor switching elements.

This invention is characterized by the provision of ferroelectric transistors. Therefore, unlike the arrangement using fuses, switching data may be rewritten. Furthermore, since the rewriting of the switching data requires only the polarization of the ferroelectric substance, the rewriting takes only a short period of time. Furthermore, the polarized state is retained even after the power is turned off. Therefore, unlike arrangements using an SRAM, there is no need to provide an additional nonvolatile memory.

In other words, when this invention is used in a programmable functional device, functions may be rewritten in real time, the written data is nonvolatile, and the device becomes compact.

Furthermore, this invention is characterized by the constitution in which the lower conductive layer of the ferroelectric transistor is connected to the first region of the selecting transistor.

Therefore, by setting the selecting transistor to the on state, a voltage for writing may be directly applied between the upper and lower conductive layers of the ferroelectric transistor. Therefore, writing the switching data is not affected by parasitic capacitance or parasitic resistance due to circuit elements connected to the first and second regions of the ferroelectric transistor. Furthermore, by setting the selecting transistor to the off state, the circuit elements connected to the first and second regions of the ferroelectric transistor may be completely separated from the switching data writing circuit. As a result, switching the circuit elements according to the written data is not affected by parasitic capacitance or parasitic resistance due to circuits for writing the switching data.

In other words, this invention provides a highly reliable, programmable functional device capable of writing the switching data reliably, and switching the circuit elements reliably according to the written data.

This invention is further characterized by the constitution in which the lower conductive layer of the ferroelectric transistor is directly connected to the first region of the selecting transistor.

Therefore, no wiring is required for connecting the lower conductive layer of the ferroelectric transistor to the first region of the selecting transistor. That is to say, a further compact, reliable, programmable functional device may be provided.

Another characteristic of this invention is to provide required functions by writing switching data to a selected ferroelectric transistor by applying a voltage having a predetermined value and polarity between any row selecting line and column selecting line while applying a write enabling voltage to a write enabling line and carrying out switching among circuit elements according to the written switching data by applying a write disabling voltage to the write enabling line.

In other words, a programmable functional device is provided with which, even when the semiconductor elements for switching are arranged in rows and columns, the switching data may be reliably written to any semiconductor element for switching, and the circuit elements may be reliably switched according to the written switching data.

Another characteristic of this invention is to provide required functions by writing switching data to a selected ferroelectric transistor by applying a voltage having a predetermined value and polarity between any row selecting line and column selecting line while applying a write enabling voltage to a row write enabling line or to a column write enabling line and carrying out switching among circuit elements according to the written switching data by applying a write disabling voltage to the row write enabling line or to the column write enabling line.

Therefore, there is no possibility of an erroneous writing to semiconductor elements for switching belonging to rows or columns other than those to which the write enabling voltage is applied through the row write enabling line or the column write enabling line. In other words, a further highly reliable, programmable functional device is provided.

While preferred embodiments of this invention are described above, the technical terms are used not for the purpose of limiting but for explanation, and therefore may be changed within the scope of the appended claims.

What is claimed is:

1. A semiconductor switching element, comprising
   a ferroelectric transistor including a first insulation film made of insulating material, a lower conductive layer made of a first conducting material provided on the first insulation film, a ferroelectric layer made of ferroelectric material provided on the lower conductive layer, and an upper conductive layer made of a second conductive material provided on the ferroelectric layer, on a channel region formed between a first region and a second region; and a selecting transistor including a second insulation film made of insulating material, and a third conductive layer made of a third conductive material provided on the second insulation film on a channel region formed between a third region and a fourth region;

wherein the lower conductive layer of the ferroelectric transistor and the third region of the selecting transistor are electrically connected to carry a non-tunneling current.

2. A semiconductor switching element according to claim 1, wherein the first region of the ferroelectric transistor is a source, the second region is a drain, the first insulation film is a gate oxidation film, the lower conductive layer is a floating gate, and the upper conductive layer is a control gate.

3. A semiconductor switching element according to claim 1, wherein the third region of the selecting transistor is a source, the fourth region is a drain, the second insulation film is a gate oxidation film, and the third conductive layer is a gate.

4. A semiconductor switching element according to claim 1, wherein the lower conductive layer of the ferroelectric transistor is directly connected to the third region of the selecting transistor.

5. A semiconductor switching element according to claim 1, wherein the lower conductive layer of the ferroelectric transistor is indirectly connected to the third region of the selecting transistor.

6. The semiconductor switching element according to claim 1, wherein, a voltage for writing switching data is directly applied between the upper and lower conductive layers of the ferroelectric transistor through the fourth region of the selecting transistor by setting the selecting transistor to the on state when a switching data writing mode is carried out, and both the first region and the second region of the ferroelectric transistor and the fourth region of the selecting transistor are electrically disconnected by setting the selecting transistor to the off state when an operating mode is carried out.

7. A programmable functional device for obtaining required functions by interconnecting or disconnecting a plurality of circuit elements prepared in advance by means of programmable switching means, comprising a plurality of circuit elements to be connected;

a plurality of switching elements for programmably connecting the plurality of circuit elements, each switching element including a ferroelectric transistor having a first an insulation film made of insulating material, a lower conductive layer made of a first conducting material provided on the first insulation film, a ferroelectric layer made of ferroelectric material provided on the lower conductive layer, and an upper conductive layer made of a second conductive material provided on the ferroelectric layer, on a channel region formed between a first region and a second region; and a selecting transistor including a second insulation film made of insulating material, and a third conductive layer made of a third conductive material provided on the second insulation film on a channel region formed between a third region and a fourth region;

wherein the lower conductive layer of the ferroelectric transistor and the third region of the selecting transistor are electrically interconnected to carry a non-tunneling current, and each of the circuit elements to be switched is connected to the first and second regions of the ferroelectric transistor of an associated switching element.

8. A programmable functional device according to claim 7, wherein a number of the plurality of semiconductor switching elements are arranged in rows and columns, the upper conductive layers of the ferroelectric transistors in a same row are interconnected to form a row selecting line, the fourth regions of the selecting transistors in a same column are interconnected to form a column selecting line, and the third conductive layers of all the selecting transistors are interconnected to form a write enabling line.

9. A programmable functional device according to claim 8, characterized in that the programmable functional device is a Programmable Logic Device provided with an AND part and an OR part.

10. A programmable functional device according to claim 7, wherein a number of the plurality of semiconductor switching elements are arranged in rows and columns, the upper conductive layers of the ferroelectric transistors in a same row are interconnected to form a row selecting line, the fourth regions of the selecting transistors in a same column are interconnected to form a column selecting line, and the third conductive layers of the selecting transistors in the same row are interconnected to form a row write enabling line.

11. A programmable functional device according to claim 10, wherein the programmable functional device is a Programmable Logic Device provided with an AND part and an OR part.

12. A programmable functional device according to claim 7, wherein a number of the plurality of semiconductor switching elements are arranged in rows and columns, the upper conductive layers of the ferroelectric transistors in a same row are interconnected to form a row selecting line, the fourth regions of the selecting transistors in a same column are interconnected to form a column selecting line, and the third conductive layers of the selecting transistors in the same column are interconnected to form a column write enabling line.

13. A programmable functional device according to claim 12, wherein the programmable functional device is a Programmable Logic Device provided with an AND part and an OR part.

14. A programmable functional device according to claim 7, wherein a voltage for writing switching data is directly applied between the upper and lower conductive layers of the ferroelectric transistor through the fourth region of the selecting transistor by setting the selecting transistor to the on state when a switching data writing mode is carried out, both the first region and the second region of the ferroelectric transistor and the fourth region of the selecting transistor are electrically disconnected by setting the selecting transistor to the off state when an operating mode is carried out.

15. A method for operating a programmable functional device, comprising:

providing a programmable function device having a plurality of circuit elements to be connected, a plurality of switching elements for programmably connecting the plurality of circuit elements, each switching element including a ferroelectric transistor having a first an insulation film made of insulating material, a lower conductive layer made of a first conducting material provided on the first insulation film, a ferroelectric layer made of ferroelectric material provided on the lower conductive layer, and an upper conductive layer made of a second conductive material provided on the ferroelectric layer, on a channel region formed between a first region and a second region, and a selecting transistor including a second insulation film made of insulating material, and a third conductive layer made of a third conductive material provided on the second insulation film on a channel region formed between a third region and a fourth region, wherein the lower conductive layer of the ferroelectric transistor and the third region of the selecting transistor are electrically interconnected to carry a non-tunneling current, each of the circuit elements to be switched is connected to the first and second regions of the ferroelectric transistor of an associated switching element, a number of the plurality of semiconductor switching elements are arranged in rows and columns, the upper conductive layers of the ferroelectric transistors in a same row are interconnected to form a row selecting line, the fourth regions of the selecting transistors in a same column are interconnected to form a column selecting line, and the third conductive layers of a group of the selecting transistors are interconnected to form a write enabling line;

selecting a semiconductor switching element having associated selected row selecting and column selecting lines;

applying a voltage of predetermined magnitude and polarity between the selected row selecting line and the selected column selecting line while applying a write enabling voltage to the write enabling line so as to write switching data to the selected semiconductor switching element; and applying a write disabling voltage to the write enabling line so as to switch among circuit elements switching among the circuit elements according to the written switching data.

16. The method according to claim 15, wherein the group of the selecting transistors includes all of the selecting transistors, and the write enabling voltage is applied to all of the semiconductor switching elements.

17. A method according to claim 16 wherein the programmable functional device is a PLD provided with an AND part and an OR part.

18. The method of claim 15, wherein the group of selecting transistors includes selecting transistors lying in a same row, the write enabling line is a row write enabling line, and the write enabling voltage is applied to semiconductor switching elements lying in a same row.

19. A method according to claim 18, wherein the programmable functional device is a PLD provided with an AND part and an OR part.

20. The method of claim 15, wherein the group of selecting transistors includes selecting transistors lying in a same column, the write enabling line is a column write enabling line, and the write enabling voltage is applied to semiconductor switching elements lying in a same column.

21. A method according to claim 20, wherein the programmable functional device is a PLD provided with an AND part and an OR part.

22. A method according to claim 15, wherein a voltage for writing switching data is directly applied between the upper and lower conductive layers of the ferroelectric transistor through the fourth region of the selecting transistor by setting the selecting transistor to the on state when a switching data writing mode is carried out, both the first region and the second region of the ferroelectric transistor and the fourth region of the selecting transistor are electrically disconnected by setting the selecting transistor to the off state when an operating mode is carried out.

* * * * *